United States Patent [19]
Matsuzawa et al.

[11] Patent Number: 6,080,292
[45] Date of Patent: Jun. 27, 2000

[54] MONITORING APPARATUS FOR PLASMA PROCESS

[76] Inventors: Reiji Matsuzawa; Hiroyuki Sase; Masanori Nanamura; Yasufumi Itoh, all of 5-8, Fujimi 1-chome, Chiyoda-ku, Tokyo 102, Japan

[21] Appl. No.: 08/974,498

[22] Filed: Nov. 19, 1997

[30] Foreign Application Priority Data

Nov. 19, 1996 [JP] Japan .................................. 8-307855

[51] Int. Cl.[7] .................................................. C23C 14/100
[52] U.S. Cl. ............................... 204/298.03; 204/298.32; 204/192.13; 204/406; 118/712; 118/713
[58] Field of Search ........................ 204/298.03, 298.32, 204/192.1, 192.11–192.13, 192.14, 406; 118/712, 713, 714; 156/345

[56] References Cited

U.S. PATENT DOCUMENTS 5,556,549  9/1996  Patrick et al. ............................. 216/61
5,576,629  11/1996  Turner et al. ............................. 324/709

*Primary Examiner*—Mark Kopec
*Assistant Examiner*—Derrick G. Hamlin
*Attorney, Agent, or Firm*—Liniak, Berenato, Longacre & White

[57] ABSTRACT

A monitoring apparatus for plasma process of the present invention detects the change of conditions of a plasma processing apparatus to omit the defective products in the earlier stage of the process and omits the unnecessary steps to decrease the manufacturing cost. The monitoring apparatus is to monitor the change of conditions of the plasma processing apparatus and comprises a detecting means for detecting power supplied to the plasma processing apparatus, and a detecting means for detecting the change of conditions of the plasma processing apparatus from the change of power detected by the detecting means.

11 Claims, 3 Drawing Sheets

MONITORING APPARATUS FOR PLASMA PROCESS

BACKGROUND OF THE INVENTION

1. Field of the Invention

The present invention relates to a monitoring apparatus for plasma process, which detects the change of conditions of a plasma processing apparatus in order to decrease the defective products due to the change of the apparatus conditions and to select the products which may be defective.

2. Prior Art

Recently, in the manufacture of semiconductor, magnetic storage media, optical storage media, liquid crystal display units and others, to form various kinds of thin films on a substrate, an apparatus which can accurately control the thickness of film is required. To satisfy this condition, plasma processing apparatus which employs plasma technologies have been utilized.

This plasma processing apparatus is shown in FIG. 1. As shown in FIG. 1, The plasma processing apparatus comprises a film forming unit 10 for forming a thin film, a power supply 20 for supplying high voltage to the film forming unit 10, a vacuum pump 30 for forming the forming unit 10 into a vacuum and a gas tank 40 for supplying sputtering gas to the film forming unit 10.

The film forming unit 10 is a sputtering apparatus for forming the thin film by generating plasma with glow discharge. The film forming unit 10 comprises a cathode 50 to be a target and a substrate holder 60, which are faced to the other, and a substrate 70 on which a thin film is formed is mounted on the substrate holder 60.

The film forming unit 10 is formed a vacuum of $10^{-2}$–$10^{-4}$ Torr by the vacuum pump 30, and the sputtering gas such as argon is supplied to the unit 10 from the gas tank 40. Next, the voltage of –500 V is applied to the cathode 50 by the power supply 20 through a connecting cable 80, and then, the glow discharge is generated.

Ions generated by the glow discharge collide to the cathode 50 and then neutral particles that are substance of the cathode 50 and secondary electrons are emitted. The emitted neutral particles are deposited to the substrate 70 to form a thin film 70a.

However, in the above-described plasma processing apparatus, the abnormal discharge such as arc discharge is generated due to the fluctuation of the power supply 20, the consumption of the cathode 50, the fluctuation of the vacuum, and the change of the components and density of the sputtering gas. In a case that the abnormal discharge is generated, the thin film may partially have the different properties, which is a problem in the thin film forming process.

In order to decrease the generation of the different properties in the thin film, the skilled operator monitors and controls the film forming unit 10, the power supply 20, the vacuum pump 30, the gas tank 40 and others, and after the process, all products are inspected to separate the defective products.

Further, the quality of thin film depends on the materials and the apparatus and the peripheral devices in the film forming process. Keeping the reliance and uniformity of the plasma generating mechanism is difficult since checking the every parameters is hard and keeping the normal conditions of the film forming process in long time is difficult.

In particular, generating the plasma stably and keeping the stable condition are very difficult.

SUMMARY OF THE INVENTION

It is an object of the present invention to provide a monitoring apparatus for plasma process, which detects the change of conditions of a plasma processing apparatus to omit the defective products in the earlier stage of the process and which omits the unnecessary steps to decrease the manufacturing cost.

A monitoring apparatus for monitoring the change of conditions of a plasma processing apparatus of the present invention comprises a detecting means for detecting power supplied to the plasma processing apparatus, and a detecting means for detecting the change of conditions of the plasma processing apparatus from the change of power detected by the detecting means.

Here, the monitoring apparatus may comprises a counting means for counting the number of change of conditions of the plasma processing apparatus, a rate of generation counting means for counting the rate of generation of the change of conditions of the plasma processing apparatus, a first distinguishing means for distinguishing the scale of change of conditions of the plasma processing apparatus, a transmitting means for transmitting the information of the conditions and the change of conditions of the plasma processing apparatus to a data processing apparatus, a second distinguishing means for distinguishing a product when the change of conditions of the plasma processing apparatus occurs, and a displaying means for displaying at least one of the conditions, the change of conditions, the number of change of conditions and the rate of change of conditions of the plasma processing apparatus.

Further, when the change of conditions occurs in the plasma processing apparatus, the plasma processing apparatus is controled according to a signal from the monitoring apparatus.

PREFERRED EMBODIMENTS OF THE PRESENT INVENTION

The preferred embodiments of the present invention will be described with reference to the accompanying drawings.

Figure 1:
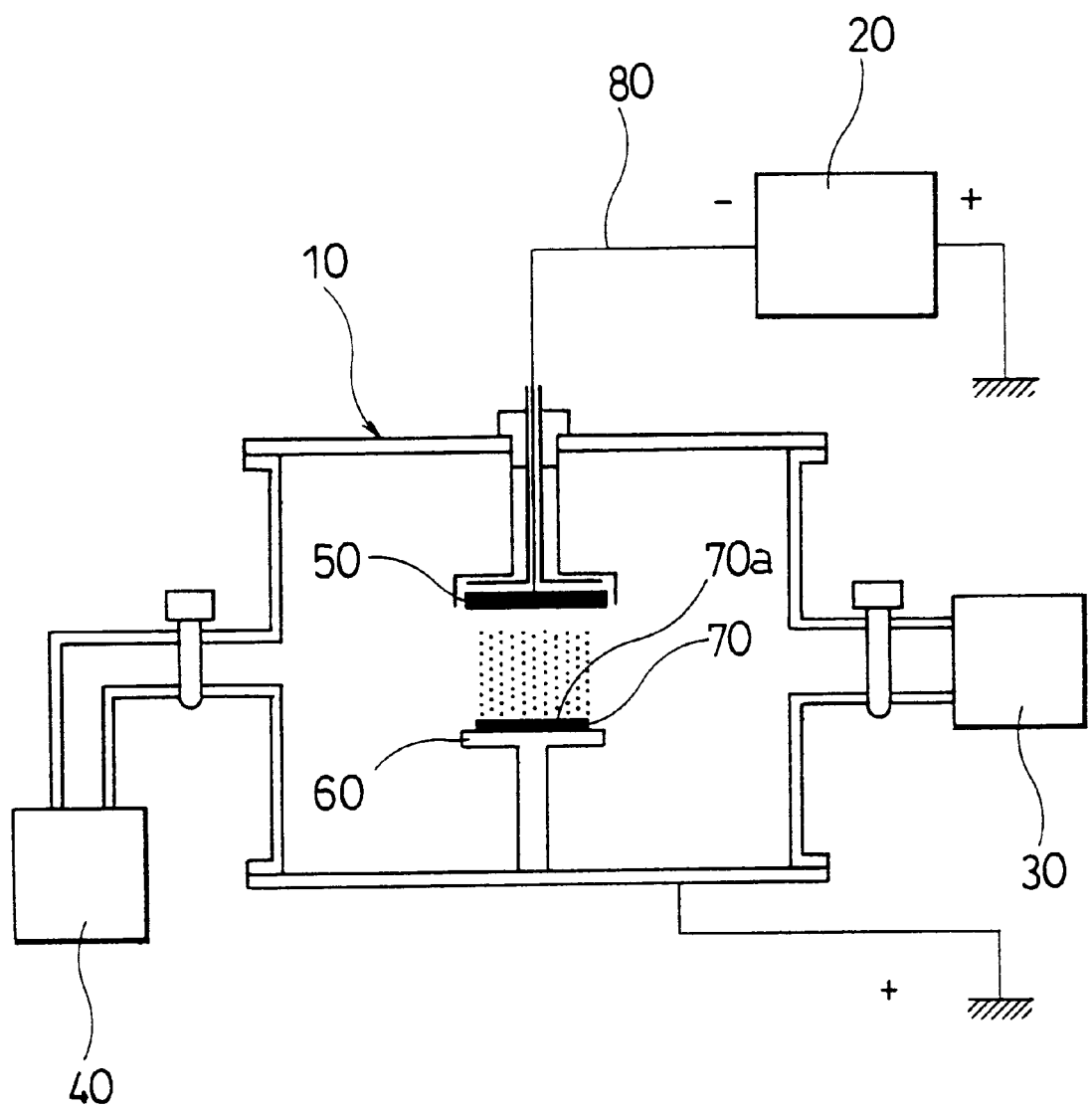
FIG. 1 is a schematic view showing the structure of the conventional plasma processing apparatus.
Figure 2:
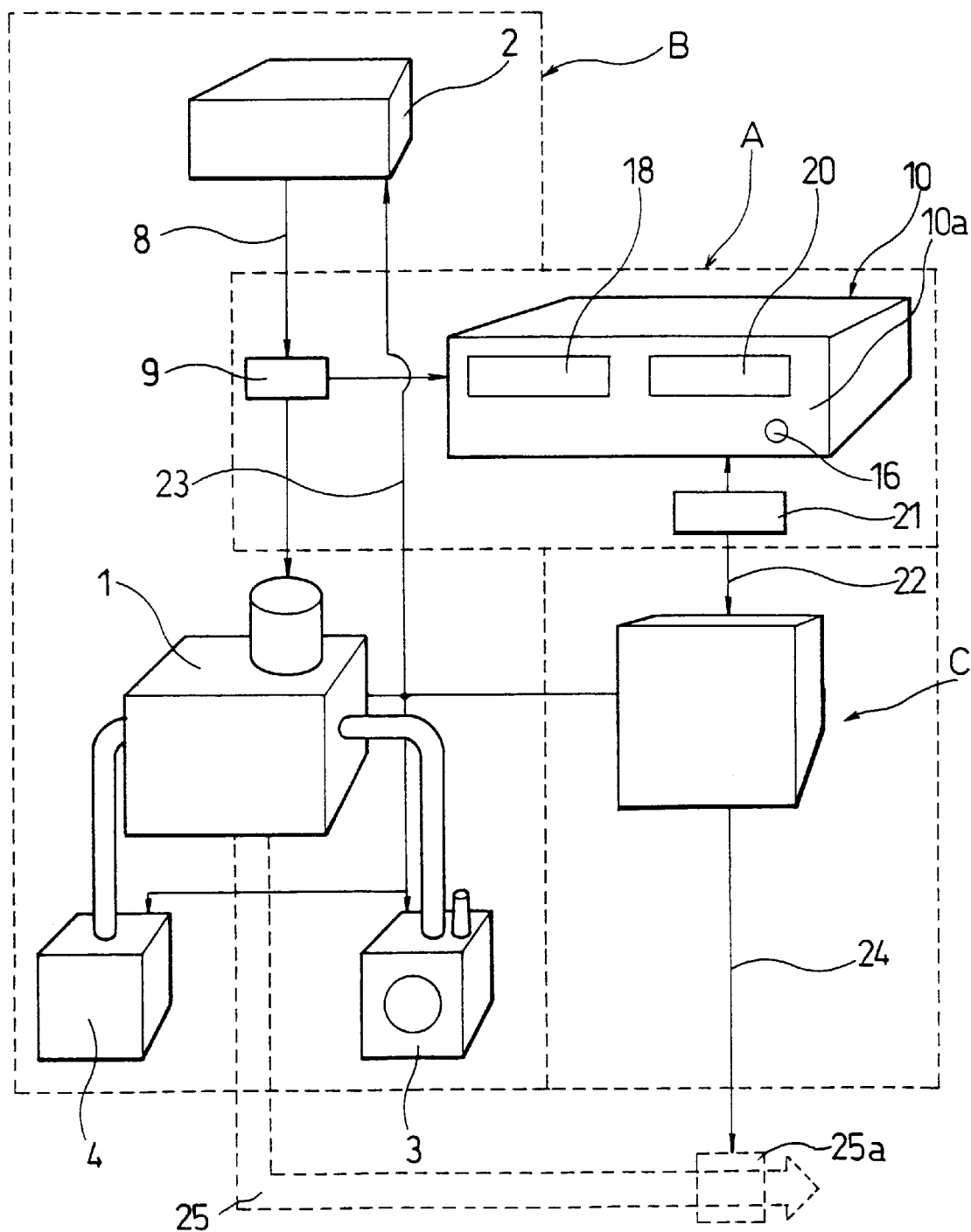
FIG. 2 is a schematic view showing a plasma processing apparatus utilizing a monitoring apparatus for the plasma process.

FIG. 2 is a schematic view showing a plasma processing apparatus utilizing a monitoring apparatus for the plasma processing.

Figure 3:
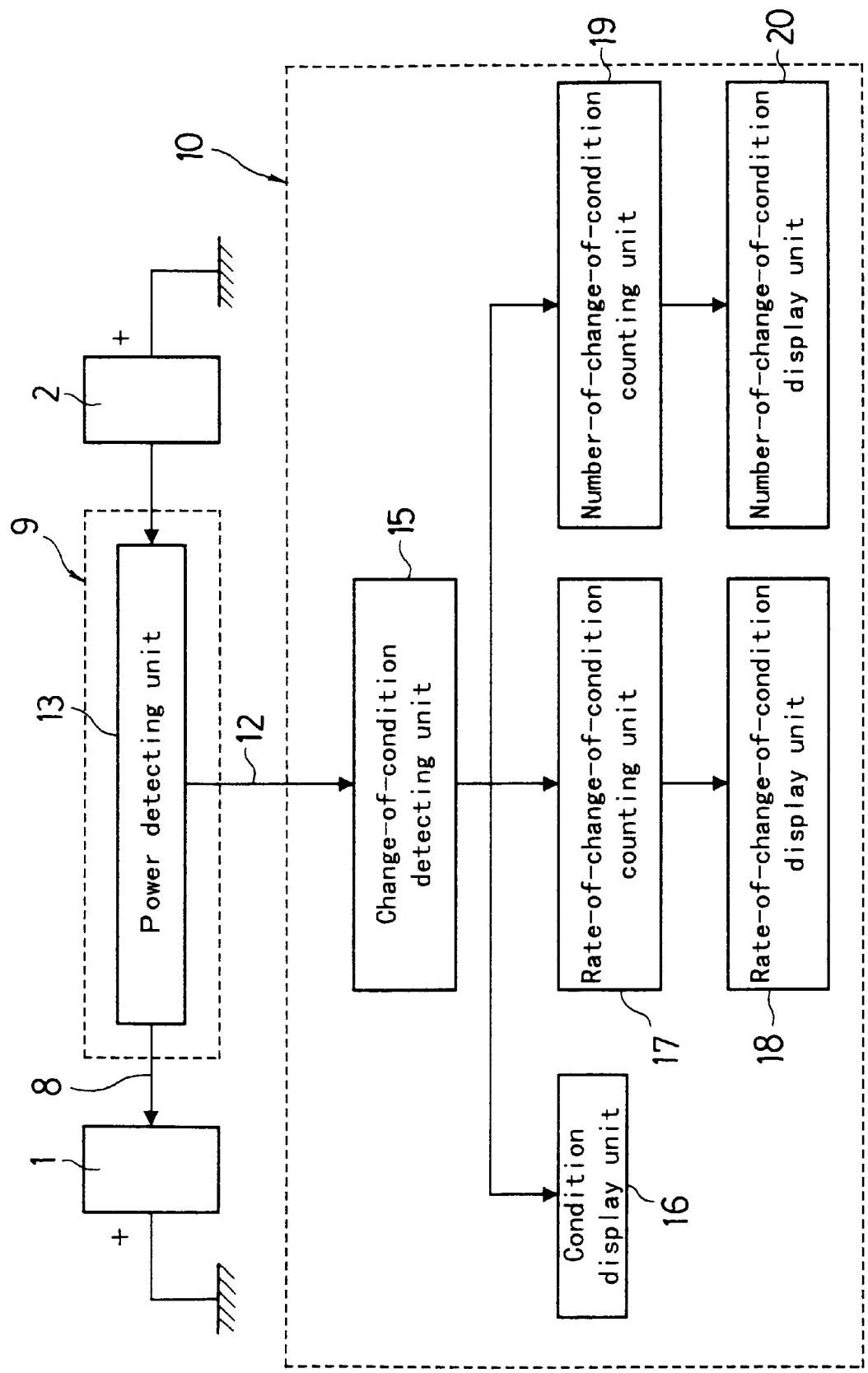
FIG. 3 is a block diagram showing the structure of the monitoring apparatus of FIG. 2.

FIG. 3 is a block diagram showing the structure of the monitoring apparatus of FIG. 2.

First, a monitoring apparatus A for plasma process comprises a detecting unit 9 for detecting the power to be supplied to a plasma processing apparatus B, and a main unit 10 for checking the change of conditions of the plasma processing apparatus B from the change of power detected by the detecting unit 9.

The plasma processing apparatus B comprises a film forming unit 1 for forming a thin film, a power supply 2 for supplying the high voltage to the film forming unit 1, a vacuum pump 3 for forming the film forming unit 1 into a vacuum, and a gas tank 4 for supplying sputtering gas to the film forming unit 1. The detecting unit 9 of the monitoring apparatus A is connected to a connecting cable 8 which connects the film forming unit 1 with the power supply 2.

A data processing apparatus C is connected to the main unit 10 of the monitoring apparatus A and connected to the manufacturing processing apparatus with a connecting cable 24 to control the substrate 7 produced by the plasma processing apparatus B.

The main unit 10 is connected to the detecting unit 9 with a connecting cable 12.

As shown in FIG. 3, the detecting unit 9 connected to the film forming unit 1 and the power supply 2 with a connecting cable 8 has a power detecting unit 13. The value detected by the power detecting unit 13 is measured by a condition change detecting unit 15 of the main unit 10, which will be described later, through the cable 12.

As shown in FIGS. 2 and 3, the main unit 10 has a condition display unit 16 for displaying the change of condition of the plasma processing apparatus B with a lamp, placed on a front panel 10a of a housing, a rate-of-change-of-condition display unit 18 for displaying the number of generation of the change of conditions per hour, and a number-of-change-of-condition display unit 20 for displaying the accumulation of generation of the change of conditions. Further, the main unit 10 has a connector (not shown) to be connected to the detecting unit 9 and the data processing apparatus C at the back of the housing.

Inside of the main unit 10, as shown in FIG. 3, a change of condition detecting unit 15 for deciding whether the change of conditions of the plasma plasma processing apparatus B occurs by measuring the power from the detecting unit 9, the condition display unit 16 for displaying the decision of the change of condition detecting unit 15, a rate-of-change-of-condition counting unit 17 for counting the number of generation of the change of conditions per hour from the data loaded by the change of condition detecting unit 15, the rate-of-change-of-condition display unit 18 for displaying the counted result of the counting unit 17, a number-of-change-of-condition counting unit 19 for counting the accumulation of generation of the change of conditions loaded from the change of condition detecting unit 15, and the number-of-change-of-condition display unit 20 for displaying the counted result of the number-of-change-of-condition counting unit 19.

The change of condition detecting unit 15 comprises a trigger circuit, a low pass filter, a high pass filter, and a comparator. The change of condition detecting unit 15 loads a detecting signal applied from the power detecting unit 9 by opening the gate with the trigger circuit, cuts the noise with the low pass filter and the high pass filter and decides whether the change of conditions occurs by comparing the conditions set in the comparator.

The result is fed to the condition display unit 16, the rate-of-change-of-condition counting unit 17 and the number-of-change-of-condition counting unit 19. It should be noted that a plurality of comparators may be used. In this case, if the comparing condition is set to every comparator, the scale of the change of conditions can be known. Further, in this case, a plurality of the rate-of-change-of-condition counting unit 17 and a plurality of the number-of-change-of-condition counting unit 19 are used.

The condition display unit 16 displays the change of conditions of the plasma processing apparatus B with a lamp. In order to show the result of decision of the change of condition detecting unit 15, for example,if the condition of the plasma processing apparatus B is normal, a green lamp is turned on, and if the condition of the film forming unit1 of the plasma processing apparatus B is abnormal, a red lamp is turned on to notify the abnormal condition.

The counting unit 17 counts the signal which notifies the generation of the change of conditions and which transmitted from the change of condition detecting unit 15 per unit time. For example, the unit time is selected from 0.125 seconds, 0.25 seconds, 0.5 seconds, 1 second, 2 seconds. The counted result is transmitted to the rate-of-change-of-condition display unit 18 to display the result.

The rate-of-change-of-condition display unit 18 has a three digit displaying segment to display the number counted by the rate-of-change-of-condition counting unit 17. Further, the display unit 18 has a counter reset switch to reset the counted number.

The number-of-change-of-condition counting unit 19 accumulates and counts the signal showing the generation of the change of condition transmitted from the change of condition detecting unit 15.

Next, the counted result is transmitted to the number-of-change-of-condition display unit 20 to display the result.

The number-of-change-of-condition display unit 20 has a five digit displaying segment to display the number counted by the number-of-change-of-condition counting unit 19. Further, the number-of-change-of-condition display unit 20 has a counter reset switch to reset the counted number.

Next, the operation of the monitoring apparatus A for plasma process having the above-described structure will be described.

In the plasma processing apparatus B, if the arc is generated in the film forming unit 1, the resistance between the cathode 5 and the anode 1 is drastically lowered and large current is flowed thereto and voltage drop occurs.

Damage to the products is decided from the accumulated power at the arc generation, which is obtained from the following equation (1).

$$P = \int_{t_1}^{t_2} |V_t \cdot i_t| dt \qquad (1)$$

where $t_1$: starting time of arc
$t_2$: finishing time of arc

The accumulated power is obtained from a power detecting circuit having a voltage detecting circuit, a current sensor, a multiplier and an integrator. In particular, the output of the voltage detecting circuit and the output of the current sensor are applied to the multiplier, and the multiplication is performed by the multiplier. Then, the instant power can be obtained. When the arc is generated, the output voltage is lowered, and the output current is largely varied. The discharge energy due to arc can be obtained by detecting the change of the voltage or current with the voltage detecting circuit or the current sensor, and integrating the output of the multiplier by the integrator while the change occurs.

Further, the accumulated power can be obtained by the amount of voltage drop of the amount of change of current. In this case, since the power supply 2 generally comprises a smoothing condenser, the energy proportional to the square of the voltage drop or the change of current is discharged, and from this value, the damage to the products is decided.

The change of condition detecting unit 15 decides whether arc is generated in the above-described ways, and the result is displayed by the display unit 16 with the color lamp. When the some abnormal condition occurs, the number of generation per unit time is counted by the rate-of-change-of-condition counting unit 17 and the rate-of-change-of-condition display unit 18 displays the counted number, and the accumulated number of generation is counted by the number-of-change-of-condition counting unit 19 and the counted number is displayed by the number-of-change-of-condition display unit 20.

These results are transmitted to the data processing apparatus C through the connecting cable 22 over an interface 21 that is means of communication as shown in FIG. 2.

The data processing apparatus C totally examines the results and the film forming unit 1, the power supply 2, the vacuum pump 3 and the gas tank 4 are controled by the result of the apparatus C through the connecting cable 23. In the data processing apparatus C, the damage to the thin film formed on the substrate 7 due to the arc generation is decided by the result transmitted from the monitoring apparatus A, and the basis for decision making is the number of generation of arc and the scale of arc.

If the result of the data processing apparatus C is that the thin film of the substrate 7 may be damaged, as shown in FIG. 2, the result is transmitted to a selecting unit 25*a* that is means of selection of the manufacturing process 25 through the connecting cable 24.

In the manufacturing process 25, the substrate 7 which is decided damaged is selected by the time of generation of change of condition with the number-of-change-of-condition counting unit 19. Accordingly, the corresponded substrate 7 is automatically removed by the selecting unit 25*a*.

Thus, as described above, according to the present invention, the change of conditions of the plasma processing apparatus can be detected and from the detected result, the film forming unit, the plasma processing apparatus comprising the power supply, the vacuum pump, the gas tank and others can be controlled. Accordingly, the products with high quality can be manufactured and the thin film partially having the different properties can be founded and removed from the manufacturing process at the earlier stage, which can omit the unnecessary steps.

Further, in the above embodiment, the PVD apparatus for DC sputtering has been described as the plasma processing apparatus; however, the monitoring apparatus of the present invention can be applied to other plasma processing apparatus such as RF sputtering, ECR sputtering, etching, CVD, and ion plating, and the same effects can be obtained. This is because in other plasma processing apparatus, the same change of condition occurs.

While the invention has been shown and described with reference to the illustrated embodiments, it should be understood that various changes in form and details may be made without departing from the scope of the invention which is defined in the appended claims

What is claimed is:

1. A monitoring apparatus for monitoring the change of conditions of a plasma processing apparatus comprising:
a first detecting means for detecting a power supplied to said plasma processing apparatus; and
a second detecting means for detecting the change of conditions of said plasma processing apparatus from the change of power detected by said first detecting means, wherein said change of conditions indicates abnormal conditions caused by arc generation which causes damage to a product formed by a plasma processing apparatus,
wherein damage to said products is detected based on an accumulated power at arc generation which is obtained from the following equation, $$P = \int |V_t \times i_t| dt$$

where $t_1$ is a starting time of an arc, and $t_2$ is a finishing time of the arc.

2. A monitoring apparatus according to claim 1 further comprising a counting means for counting the number of abnormal conditions of said plasma processing apparatus.

3. A monitoring apparatus according to claim 1 further comprising a rate of generation counting means for counting the rate of generation of the abnormal conditions of said plasma processing apparatus.

4. A monitoring apparatus according to claim 1 further comprising a first distinguishing means for distinguishing the scale of abnormal conditions of said plasma processing apparatus.

5. A monitoring apparatus according to claim 1 further comprising a transmitting means for transmitting the information of the conditions and the abnormal conditions of said plasma processing apparatus to a data processing apparatus.

6. A monitoring apparatus according to claim 1 further comprising a displaying means for displaying at least one of the conditions, the abnormal conditions, the number of abnormal conditions and the rate of abnormal conditions of said plasma processing apparatus.

7. A monitoring apparatus according to claim 1, wherein when the abnormal conditions occur in said plasma processing apparatus, said plasma processing apparatus is controlled according to a signal from said monitoring apparatus.

8. The monitoring apparatus according to claim 1, wherein said arc generation is detected from one of a change of voltage and a change of current which is compared to conditions set in a comparator.

9. A monitoring apparatus for monitoring the change of condition of a plasma processing apparatus comprising:
a first detecting means for detecting a direct current power supplied to said plasma processing apparatus; and
a second detecting means for detecting an abnormal condition caused by an arc generating during a plasma process of said plasma processing apparatus from a change of direct current power detected by said first detecting means.

10. The monitoring apparatus of claim 9, wherein said second detecting means detects a change of one of voltage or current during said plasma process.

11. The monitoring apparatus according to claim 10, further comprising a data processing apparatus that processes a number of said abnormal conditions and a magnitude of each of said abnormal conditions is detected and stored, wherein said number and said magnitude determine an amount of damage a product during said plasma process.

* * * * *